United States Patent [19]

Sumiya et al.

[11] Patent Number: 5,332,629

[45] Date of Patent: Jul. 26, 1994

[54] BORON NITRIDE SYSTEM INCLUDING AN HBN STARTING MATERIAL WITH A CATALYST AND A SINTERED CNB BODY HAVING A HIGH HEAT CONDUCTIVITY BASED ON THE CATALYST

[75] Inventors: Hitoshi Sumiya; Shuichi Sato; Shuji Yazu, all of Itami, Japan

[73] Assignee: Sumitomo Electric Industries, Ltd., Osaka, Japan

[21] Appl. No.: 46,422

[22] Filed: Apr. 13, 1993

Related U.S. Application Data

[60] Continuation-in-part of Ser. No. 483,268, Feb. 16, 1990, abandoned, which is a continuation of Ser. No. 192,392, May 10, 1988, abandoned, which is a division of Ser. No. 106,911, Oct. 5, 1987, abandoned, which is a continuation of Ser. No. 815,987, Jan. 3, 1986, abandoned.

[30] Foreign Application Priority Data

Jan. 11, 1985 [JP] Japan .................................. 60-2565
May 30, 1985 [JP] Japan ............................... 60-117179

[51] Int. Cl.$^5$ .............................................. B32B 15/04
[52] U.S. Cl. ................................. 428/627; 428/457; 428/698; 501/96
[58] Field of Search ............... 428/620, 627, 632, 457, 428/689, 698, 704; 501/96

[56] References Cited

U.S. PATENT DOCUMENTS 4,188,194 2/1980 Corrigan .............................. 51/307
4,469,802 9/1984 Endo et al. .......................... 501/96
4,906,528 3/1990 Cerceau et al. ..................... 428/627
5,011,790 4/1991 Degawa et al. ...................... 501/96

FOREIGN PATENT DOCUMENTS 2344642 10/1977 France .

OTHER PUBLICATIONS

Vol. 34, J. Phys. Chem Solids, 1972, G. A. Slack "Nonmetallic Chrystals With High Thermal Conductivity" pp. 321–334.
Vol. 7, Mat. Res. Bull, 1972, M. Wakatsuki et al. "Synthesis of Polycrystalline Cubic BN", pp. 999 . . . 1003.
"Chemical Vapor Deposited Materials For Electron Tubes", Apr. 1969, S. R. Steele et al., pp. 29, 43–48.

*Primary Examiner*—George Wyszomierski
*Attorney, Agent, or Firm*—W. G. Fasse; W. F. Fasse

[57] ABSTRACT

A boron nitride system starts with an hBN material and yields a directly converted sintered cBN body having a high heat conductivity within the range of at least 4 W/cm.°C. to about 6.2 W/cm.°C. For this purpose the hBN starting material of the system has diffused therein an additive of an alkaline earth metal or alkali metal in an amount of from 0.6 mol % to 1.3 mol %. This starting material is directly converted into the cBN at a sintering temperature of at least 1350° C. under a thermodynamically stabilized condition for the cBN, which contains cBN within the range of 99.9 to 99.3 wt. % of the sintered body and a metal remainder from the additive of the starting material within the range of 0.1 to 0.7 wt. % of the sintered body, except for minute naturally occurring components.

8 Claims, 9 Drawing Sheets

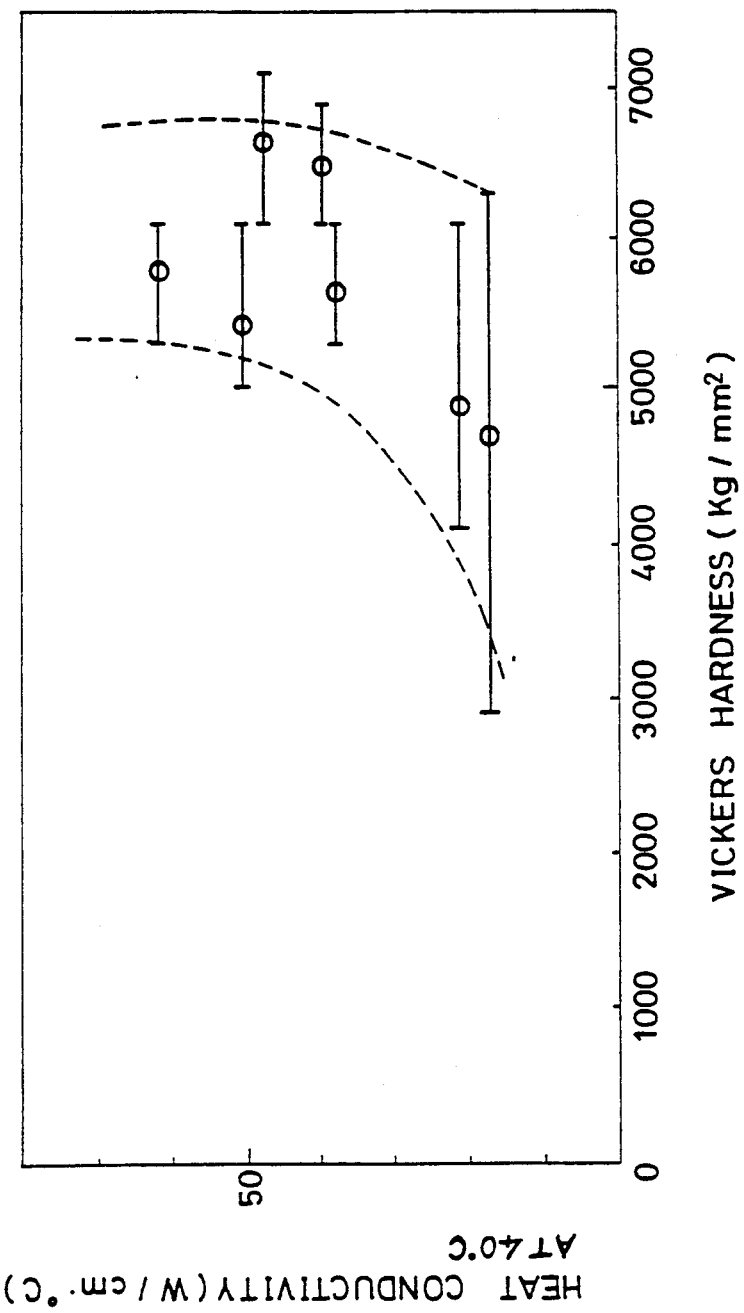

BORON NITRIDE SYSTEM INCLUDING AN HBN STARTING MATERIAL WITH A CATALYST AND A SINTERED CNB BODY HAVING A HIGH HEAT CONDUCTIVITY BASED ON THE CATALYST

CROSS-REFERENCE TO RELATED APPLICATIONS

This application is a continuation-in-part application of U.S. Ser. No. 07/483,268, filed on Feb. 16, 1990, abandoned, which is an FWC application of U.S. Ser. No. 07/192,392, filed on May 10, 1988; Abandoned, which is a divisional application of U.S. Ser. No. 07/106,911, filed on Oct. 5, 1987; Abandoned, which is an FWC application of U.S. Ser. No. 06/815,987, filed on Jan. 3, 1986, Abandoned.

FIELD OF THE INVENTION

The invention relates to a boron nitride system including an hBN starting material with a catalyst and a sintered cBN body having a high heat conductivity based on the catalyst. Such a sintered body is suitable for use as a heat sink material, for example in a semiconductor laser, a microwave device or an IC device. The invention also relates to a method for manufacturing a cubic boron nitride sintered body to provide said sintered body with a heat conductivity of at least 4 W/cm.°C.

BACKGROUND INFORMATION

Cubic system boron nitride, hereinafter referred to simply as cBN, has a hardness next to that of diamond and it has excellent thermal and chemical stability characteristics. Therefore, cBN has atracted special interest as a material for working tools. In addition, cBN has a high heat conductivity also next to that of diamond and accordingly, it is expected to be used for purposes such as the material of a heat-radiation substrate.

As the material of a heat-radiation substrate, various materials having characteristics as shown in Table 1 have been used conventionally.

TABLE 1

| Material | Heat Conductivity (at room temperature) W/cm · °C. | Thermal Expansion Coefficient (at room temperature to 400° C. | dielectric constant (1 MHz at room temperature) | Resistivity (at room temperature) Ω · cm |
|---|---|---|---|---|
| SiC | 2.7 | 3.7 | 45 | $10^{13}$ |
| BeO | 2.6 | 7.6 | 6~8 | $10^{14}$ |
| AlN | 0.6~1.6 | 4.0 | 8 | $10^{12}$ |
| Al$_2$O$_3$ | 0.2 | 6.7 | 8~10 | $10^{14}$ |
| Si | 1.3 | 3.6 | 12 | $10^{-3\sim3}$ |
| Diamond | 20 | 2.3 | 5.7 | $10^{16}$ |

Table 1 shows that diamond has a very high heat-conductivity compared with the other materials.

On the other hand, Slack predicted in J. Phys. Chem. Solids, Vol. 34 (1972)pages 321 to 334 that pure single crystal cBN would have a heat-conductivity as high as approximately 13 W/cm°C. at room temperature and suggested the possibility of using it as the material for a radiation substrate.

However, a large-size single crystal of cBN has not yet been produced as far as we know, and accordingly, the heat conductivity of 13 W/cm°C. has not been confirmed for cBN.

In addition, the largest value reported up to the present as the heat conductivity of a cBN sintered body containing a binding phase is only 2 W/cm.°C. The reason for this is supposed to be that the binding phase acts as an important factor of phonon scattering, causing the heat conductivity to be lowered excessively. Heat conductivity in non-metallic electrically insulating crystals is directly proportional to the phonon mean free path, see U.S. Pat. No. 4,188,194 (Corrigan), issued Feb. 12, 1980, col. 19.

Corrigan discloses a method for manufacturing a high heat-conductivity cBN sintered body without a binding phase, wherein a high density cBN sintered body having a high heat conductivity within the range of about 3 W/cm°C. to about 9 W/cm°C. is manufactured by a direct conversion process using pyrolytic boron nitride (pBN) as the starting raw material, please see FIG. 16 of Corrigan. Where Corrigan starts with hexagonal boron nitride in his Examples 29 and 30 the obtained heat conductivity is only about 1.33 W/cm.°C. or 1.07 W/cm°C., respectively. In col. 22, Corrigan states: "The room temperature thermal conductivity of the best U-PBN compacts is higher by a factor of 6-8 compared to the directly converted HBN powder compact (Example 29) and by a factor of about 10 compared to the composite compact (Example 30).". This result does not suggest, nor does it motivate the use of hBN as a starting material if one wants to obtain cBN with a high thermal conductivity.

Further, in the method of the U.S. Pat. No. 4,188,194 (Corrigan), a very high pressure of about 7 GPa and high temperatures of 2000° C. or more are required to manufacture a sintered body having a heat-conductivity of 4 W/cm.°C. or more. There is also a problem in that the results disclosed by Corrigan are not consistently reproducible. In addition, pyrolytic BN is a very expensive material.

On the other hand, a method for manufacturing a cBN sintered body not containing a binding phase under relatively mild conditions and at low cost is disclosed for example in a paper by Wakatsuki et al. in "Mat Res Bull" Vol 7 (1972) page 999, in which a cBN sintered body is obtained by a direct conversion process using hexagonal system boron nitride having a low degree of crystallization. However, the hBN of low degree of crystallization used as the starting raw material by Wakatsuki et al. lacks chemical stability and is liable to react with the oxygen in the air, which makes it difficult to obtain a homogenous body uniformly and sufficiently sintered overall.

The inventors of the present invention have conducted experiments on synthetic materials using various methods in order to manufacture a sintered cBN body having a high thermal conductivity of at least 4 W/cm°C. and at a low cost while permitting a good reproductiveness with consistent results. As a result, they found it most suitable to use methods as disclosed in U.S. Pat. No. 4,469,802 (Endo et al.), issued on Sep. 4, 1984, where boron nitride of an alkaline earth metal or alkali metal is mixed or diffused into a hexagonal boron nitride (hBN) and then the material is subjected to a high temperature of 1350° C. or above under a thermodynamically stabilized pressure condition of cBN. Endo et al. intend to provide a sintered cBN body having a good light-transmitting property and are not concerned with obtaining a sintered cBN body having a good heat conductivity. Part or all of the added hBN is diffused and removed out of the system in the above stated Endo et al. method at the time of sintering under a high pressure, whereby a sintered body comprised of substantially 100% cBN can be obtained.

As a result of measuring the heat conductivity of a sintered body obtained as described above according to Endo et al., it was found that the heat conductivity of such a sintered body had a relatively high value of 2 to 3 W/cm.°C. on the average compared with other sintered bodies using binding materials. However, the heat conductivity measurements also showed that in some cases the heat conductivity of such a sintered body was as low as 1.7 W/cm.°C. and thus the measured values were scattered in a rather wide range.

French Patent Publication 2,344,642 (Lalaurie et al.), published Oct. 14, 1977 discloses a process for realizing metal deposits on supports of boron nitride. Lalaurie et al. use the type of boron nitride disclosed in an article entitled "Chemical Vapor Deposited Materials for Electron Tubes" by S. R. Steele et al., published by "Clearinghouse for Federal Scientific and Technical Information" Springfield, VA, 22151, Apr. 1969, No: AD 686,342, pages 29 and 43 to 48. According to page 29 of the Steele et al. disclosure, the isotropic CVD boron nitride (standard grade) has a thermal conductivity of 0.188 W/cm.°C. (=0.045 cal/cm$^2$/cm/sec/°C. at 300° C.). Lalaurie et al. do not mention anything regarding the thermal conductivity their boron nitride substrate should have.

SUMMARY OF THE INVENTION

It is an object of the present invention to provide a sintered body of cBN having a heat conductivity of at least 4 W/cm.°C. which can be manufactured stably at low cost. Results must be reproducible consistently.

According to the present invention it has been discovered that the heat conductivity of a sintered body depends not on the conditions of sintering but considerably on the composition of the material before it undergoes the sintering treatment, that is, the amount of addition of a catalyst or additive specifically of an alkaline earth metal or an alkali metal boron nitride to the starting material of hBN. In addition, it was found that it is necessary to closely control the amount of the added alkaline earth metal or alkali metal boron nitride within a range of from 0.6 mol % to 1.3 mol % in order to achieve the desired thermal conductivity of at least 4 W/cm.°C. by the presence of a remainder metal from the catalyst in the resulting cBN sintered body.

The present invention achieves the cBN body having a high thermal conductivity of at least 4 W/cm.°C. in the form of a sintered cubic boron nitride body which consists of 99.3% wt. to 99.9% wt. of cBN and about 0.7 to about 0.1 wt.% of the remainder metal stemming from the alkaline earth metal boron nitride or from the alkali metal boron nitride diffused into the hBN starting material as a catalyst for reducing the sintering temperature and sintering pressure and for leaving the metal remainder in the sintered cBN body. The invention is thus a system of boron nitrides which starts out with a hexagonal boron nitride having uniformly diffused therein, as a catalyst and source for the metal remainder, boron nitride of an alkaline earth metal or of alkali metal in an amount of from 0.6 to 1.3 mol %, and which ends up as a cBN sintered body with the above metal remainder and with the above high thermal conductivity. The starting material is directly converted by sintering the hBN starting material at a temperature of 1350° C. and above under a high pressure sufficient to maintain a thermodynamically stabilized condition for the cubic system boron nitride.

BRIEF DESCRIPTION OF THE DRAWINGS

In order that the invention may be clearly understood, it will now be described, by way of example, with reference to the accompanying drawings, wherein:

FIG. 4 is a graph showing the Vickers hardness of a sintered body of the present invention as a function of the heat .conductivity therof;

DETAILED DESCRIPTION OF PREFERRED EXAMPLE EMBODIMENTS AND OF THE BEST MODE OF THE INVENTION

The present invention will now be specifically described in connection with a case in which a hot-pressed hBN body is used as the raw material and magnesium boron nitride ($Mg_3B_2N_4$) is used as an additive.

Figure 1:
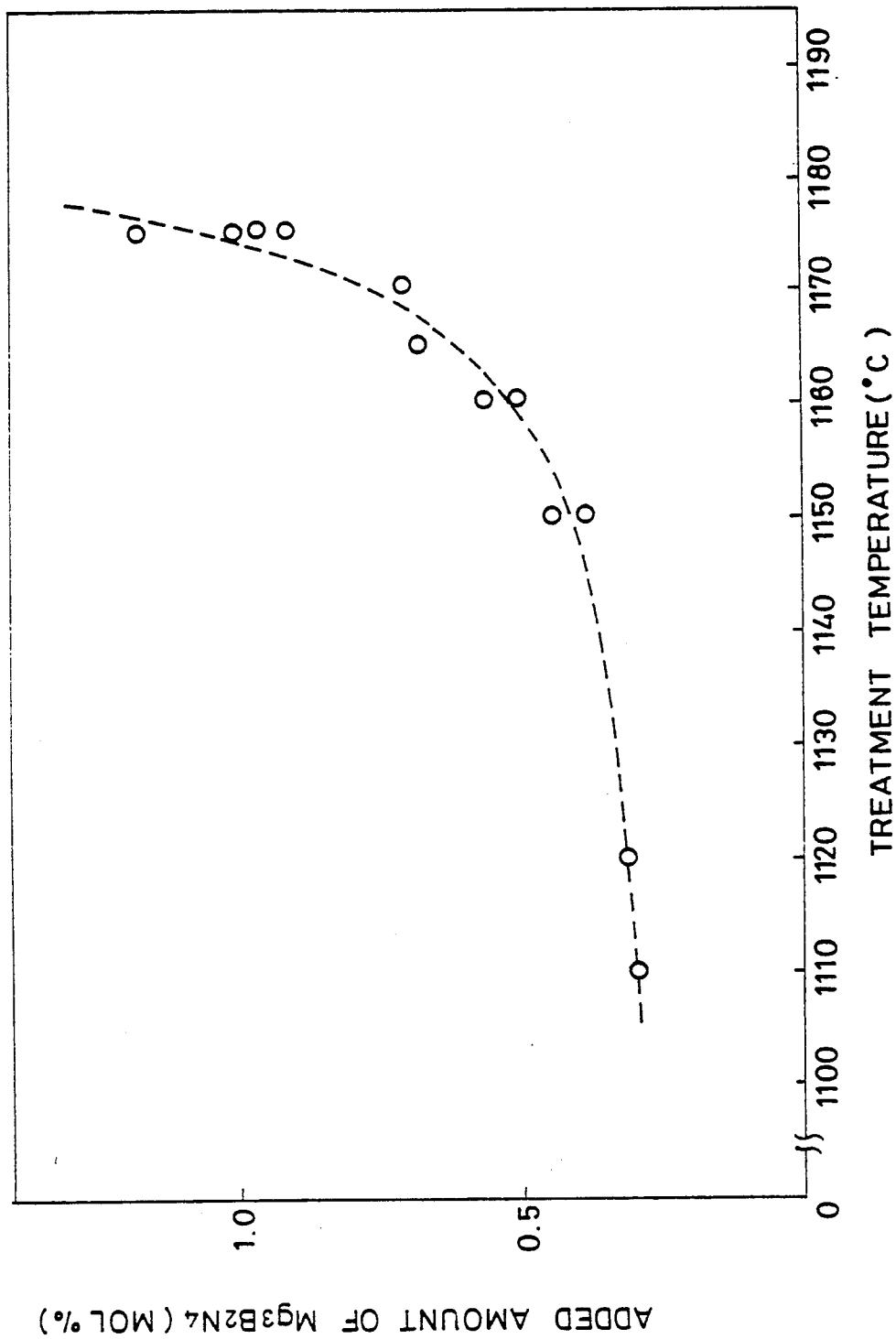
FIG. 1 is a graph showing the relationship between the diffused amount of $Mg_3B_2N_4$ and the treatment temperature for diffusing $Mg_3B_2N_4$ into the hBN starting material body.

First, an amount of $Mg_3B_2N_4$ was added to the hBN with the temperature condition being changed and thus, a relation as shown in FIG. 1 was established between the treatment temperature and the added amount to $Mg_3B_2N_4$.

Figure 2:
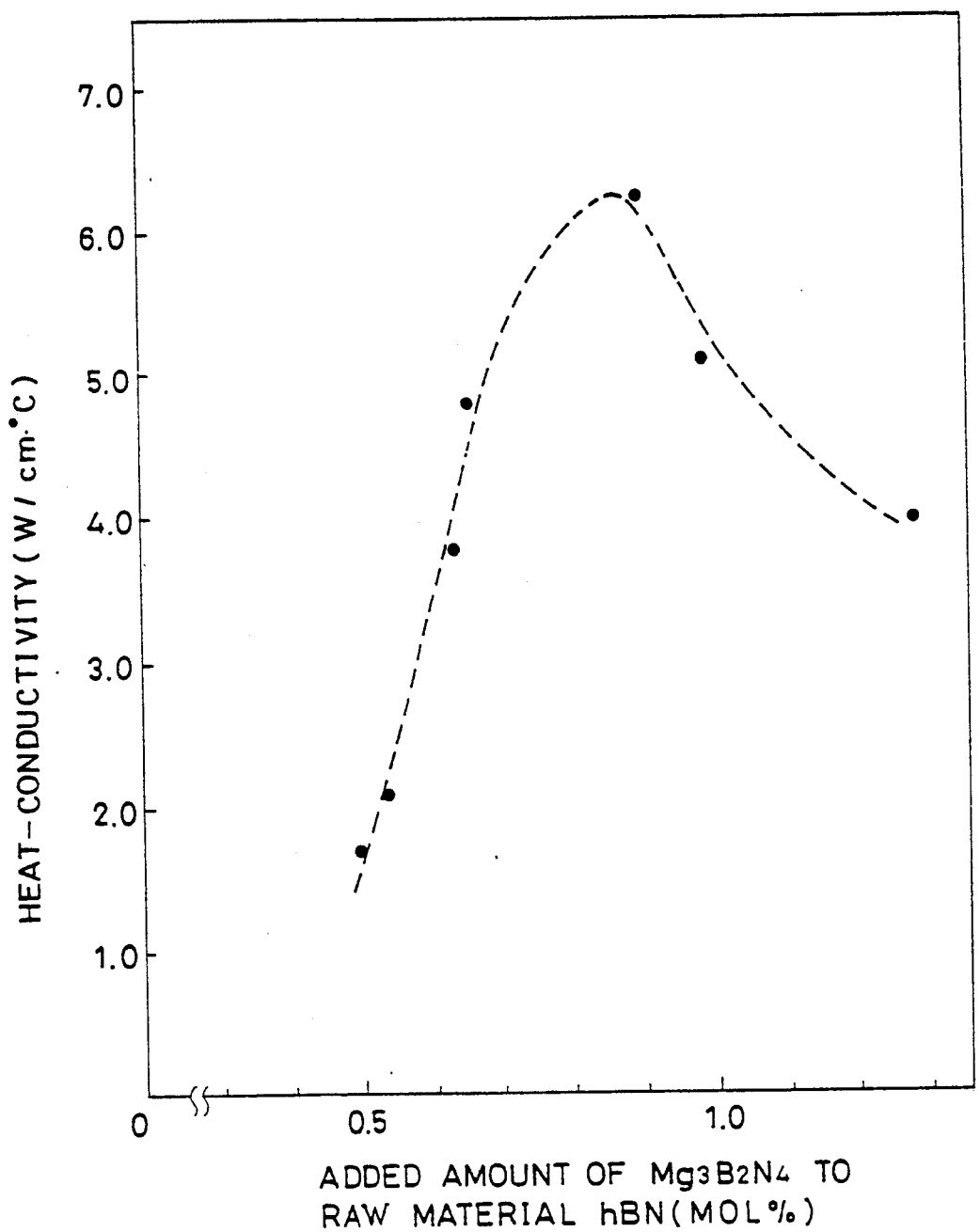
FIG. 2 is a graph showing the thermal conductivity of a sintered cBN body as a function of the amount of $Mg_3B_2N_4$ uniformly diffused into the hBN starting material.

Then, based on the result shown in FIG. 1, several materials containing different amounts of added $Mg_3B_2N_4$ were prepared and were subjected respectively to a treatment under prescribed temperature and pressure conditions, whereby sintered bodies were obtained respectively. The thermal conductivity of each of the thus obtained sintered cBN bodies was measured and the relationship between the heat conductivity and the added amount of $Mg_3B_2N_4$ was examined. FIG. 2 shows the results. FIG. 2 illustrates the discovery of the invention that the diffusion of very small amounts of the additive in the form of an alkaline earth metal boron nitride e.g. magnesium boron nitride yields a distinct peak in the thermal conductivity. About 0.6 mol % of additive, measured as a mol percentage of the hBN starting material, must be uniformly diffused into the starting hBN material in order to assure a thermal conductivity of about 4 W/cm.°C. in the final cBN sintered body. A thermal conductivity peak occurs at about 0.85 to 0.9 mol % of the additive. The thermal conductivity is back to about 4 W/cm.°C. when the additive is about 1.3 mol %.

Figure 3:
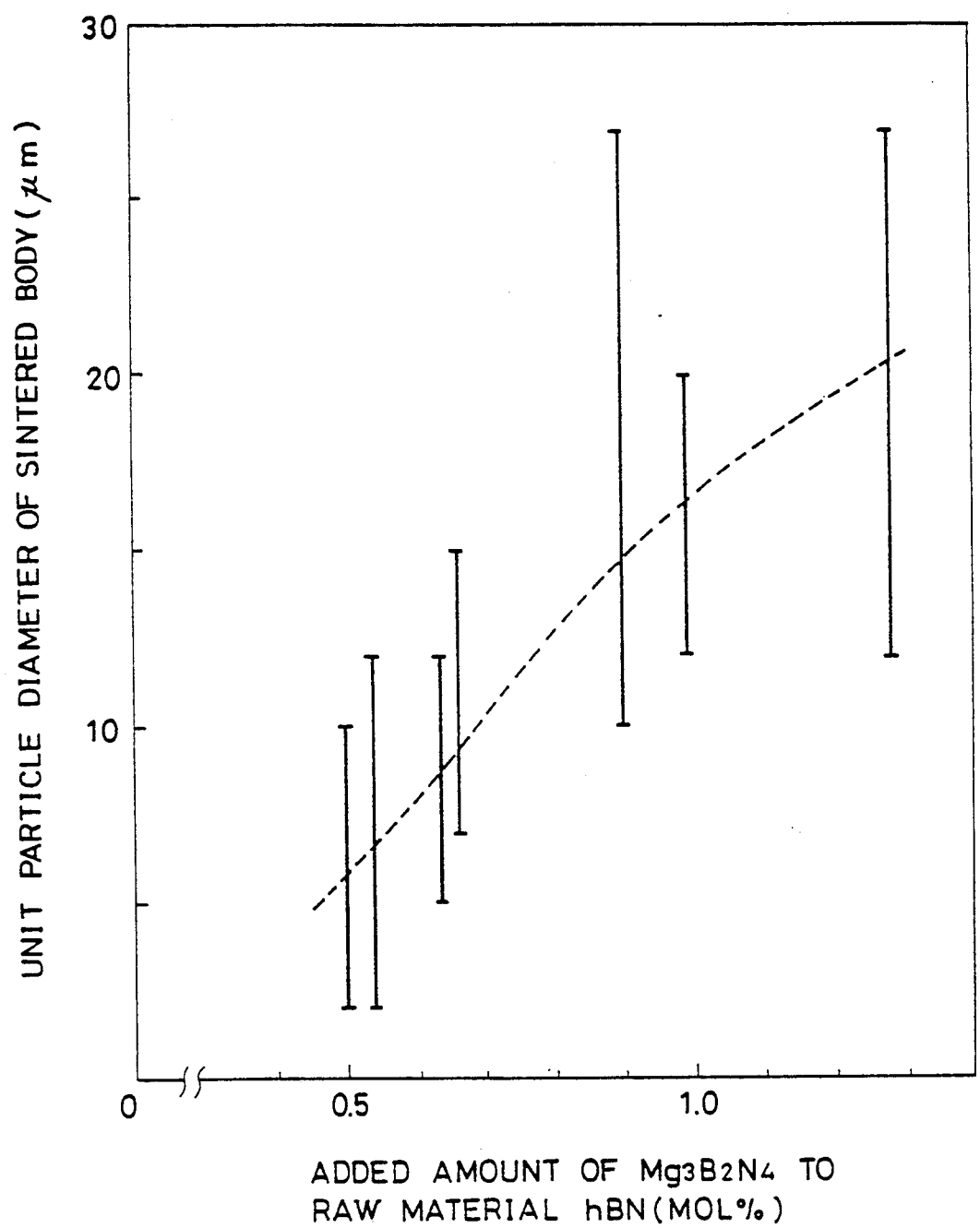
FIG. 3 is a graph showing the relationship between the unit particle diameter of a sintered cBN body of the present invention and the amount of $Mg_3B_2N_4$ diffused into the hBN starting material.

From FIG. 2 it can be seen that adding an amount of $Mg_3B_2N_4$ of approximately 0.85 to 0.9 mol %, yields the best thermal conductivity. This feature of the invention is believed to be due to the fact that, as the amount of added $Mg_3B_2N_4$ first increases, the unit particle diameter of cBN becomes larger, whereby phonon scattering in the particle boundary is decreased, which causes the heat conductivity to be high. FIG. 3 shows the relationship between the added amount of $Mg_3B_2N_4$ and an average unit particle diameter of an obtained sintered body. From FIG. 3 it can be understood that the particle diameter becomes larger according to the increase of the added amount of $Mg_3B_2N_4$.

Figure 14:
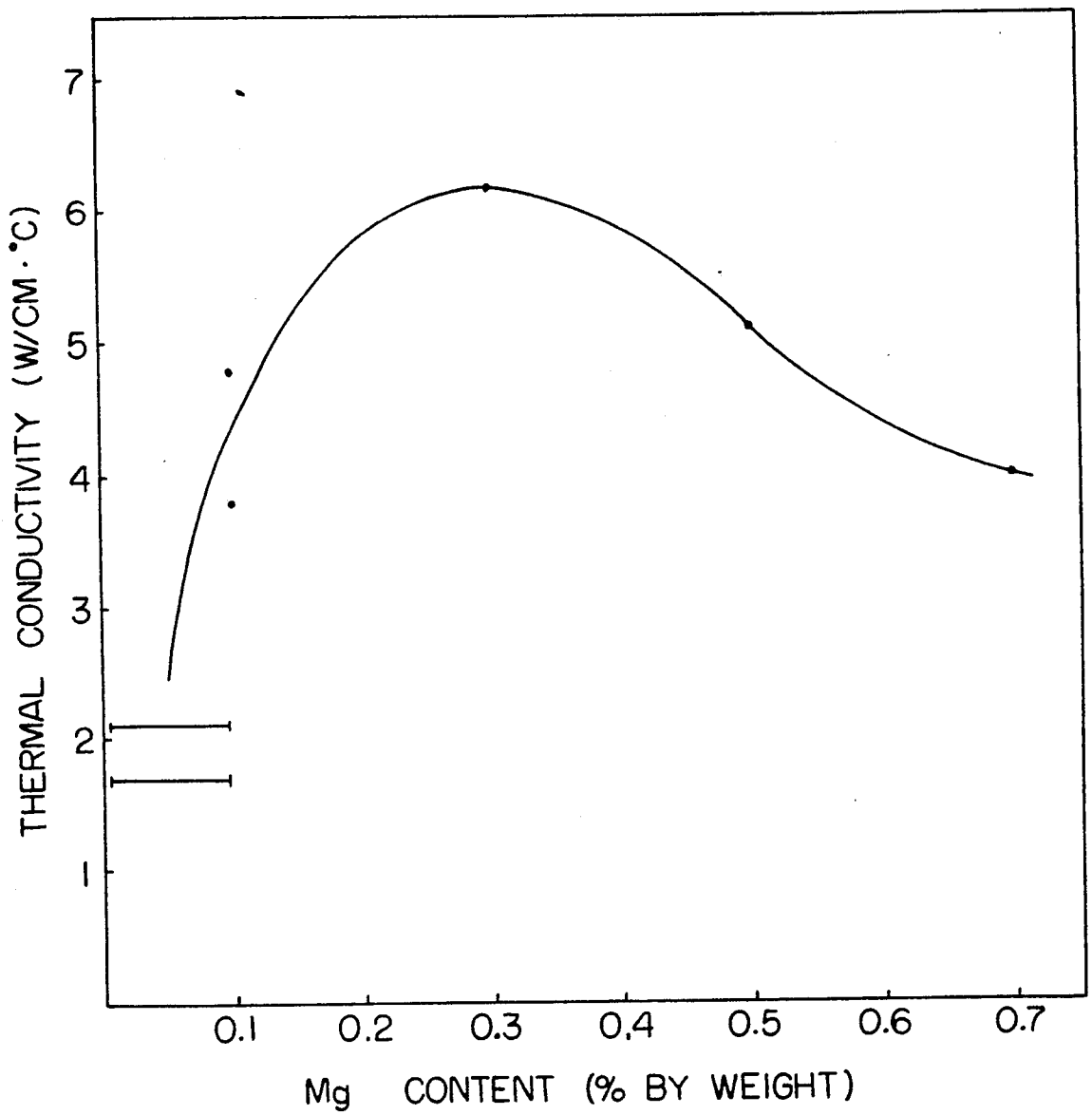
FIG. 14 shows the thermal conductivity of the cBN sintered body of the invention as a function of the metal remainder provided by the catalyst diffused into the starting hBN material.

However, from FIG. 2 it can also be seen that adding more than the optimal amount of $Mg_3B_2N_4$, namely more than 0.9 mol %, the resulting cBN sintered body contains Mg of more than 0.5 % by weight, as shown in FIG. 14. This remainder of Mg is considered to act as a determining cause of phonon scattering, causing the thermal conductivity to decrease again as is evident from FIG. 14, wherein, as in FIG. 2, the thermal conductivity is within the range of about 4 W/cm.°C. to about 6.2 W/cm.°C., whereby the lower limit is obtained when the metal remainder, here the Mg-remainder is either about 0.1 wt. % or about 0.7 wt. %, while the peak of about 6.2 W/cm.°C. is obtained for a metal remainder of about 0.3 wt. % of the cBN sintered body.

FIG. 4 shows the relationship between the heat conductivity of the respective sintered bodies with the added amount of $Mg_3B_2N_4$ being changed and the Vickers hardness thereof. It can be seen from FIG. 4 that a sintered body having a heat conductivity in a range from 2 to 3 W/cm.°C. has a Vickers hardness partially lowered and the sintered state thereof is not uniform. It is assumed that in the portion where the sintered state is not good, that is, in the portion where the hardness is lowered, phonon scattering in the particle boundary develops conspicuously due to an insufficient bonding of particles and as a result, the sintered body as a whole has a relatively low value of heat conductivity. On the other hand, a sintered body having a uniform hardness of 5000 kg/mm² or more has a heat conductivity 4 W/cm.°C. or above. From the relationship between the added amount of $Mg_3B_2N_4$ and the heat conductivity shown in FIGS. 2, 14, it is understood that a sintered body having a high heat conductivity of at least 4 W/cm.°C. or above can be stably obtained with the added amount of $Mg_3B_2N_4$ being in a range from 0.6 mol % to 1.3 mol %.

Furthermore, it has also been discovered according to the invention that in a cBN sintered body, each of the following features contribute to an improved heat conductivity, namely: (a) the weight ratio of the cubic system boron nitride to the metal remainder in the sintered cBN body, (b) the lattice constant of the cubic boron nitride in the sintered body, and (c) the proportion of a substantial continuity between adjoining particles of the cubic system boron nitride particle surface. More specifically, as a result of measuring the heat conductivity while the weight ratio of the cubic system boron nitride to the metal remainder in the sintered cBN body is being increased to at least 99.3 wt. %, it was found that the heat conductivity of a sintered body becomes remarkably high, namely at least 4 W/cm.°C. or higher.

In addition, the sintering conditions were selected so that the lattice constant of the cubic system boron nitride may be changed from 3.608 Å to 3.630 Å, and under these conditions, the heat conductivity was measured. As a result, the maximum value of the heat conductivity was found to be in the vicinity of 3.615 Å and high values of at least 4.0 W/cm.°C. were found in the range from 3.610 Å to 3.625 Å. Accordingly, the lattice constant of the cBN in the cBN sintered body is preferably in a range from 3.610 Å to 3.625 Å. This is because a deviation from the stoichiometrical BN would increase lattice defects to cause phonon scattering. In such a case, if the amount of nitrogen is small, the lattice constant would be increased.

According to the invention sintered bodies were produced while changing the sintering conditions and the binding state of the cubic boron nitride particles was observed by wrapping the sintered bodies thus obtained. Then, the heat conductivity values of the sintered bodies were measured and it was found that a sintered body having a substantial continuity of 60% or more between adjoining particles has a high value heat conductivity of 4.0 W/cm.°C. or above. The reason for this is believed to be that the influence of phonon scattering in the particle boundary contributes to the heat conductivity.

According to the present invention, a cBN sintered body obtained as described above exhibits a heat conductivity as high as 4.0 W/cm.°C. and above and consequently, it becomes possible to provide a heat sink of an excellent quality for use in an electronic device.

A sintered body having a heat conductivity of 4 W/cm.°C. or above has a particle diameter of 5/μm or more, a Vickers hardness of 5000 kg/mm² or more and a content of Mg of not more than 0.7% by weight or less. This means that from the hardness and the impurity content, the heat conductivity of the sintered body can be known.

Embodiments

EXAMPLE 1

Bodies of hBN were used as starting materials. These hBN bodies were obtained by forming hBN powder with a hot-press method or a cold isostatic pressurizing method. The hBN bodies so obtained were held in $N_2$-gas at 2000~2100° C. for 4 hours to highly purify them. Impurities contained in the hBN bodies were not more than 0.05% by weight of $O_2$, not more than 0.02% by weight of carbon and not more than 200 ppm of metal impurities such as Fe, Ca or the like, and the density of the hBN bodies was in a range of 1.75~1.85 g/cm³.

Under normal pressure in a nitrogen atmosphere at various temperatures in a range from 1160° to 1175° C., $Mg_3N_2$ was diffused into high purity hBN bodies described above and eight specimens having different amounts of $Mg_3B_2N_4$ in a range from 0.4 to 1.3 mol % were obtained as a result of reaction in the hBN body. These specimens were respectively put in recipients and subjected to a pressure of 5.5 GPa and a temperature of 1450° C. for 30 minutes using a belt-type apparatus for a direct conversion of the hBN to cBN. This pressure and temperature are lower than in conventional methods not using the system with the additive as taught herein.

The obtained cBN sintered bodies were monophase high density sintered bodies each having a diameter of 30 nun and a thickness of approximately 1.5 nun. In the sintered body of specimen 1, the not converted hBN remained partial, while the other specimens appeared to be in a homogenously and strongly sintered state over the whole surface. In consequence, it is understood that for a 100% conversion of the hBN to cBN, the amount of $Mg_3B_2N_4$ added to the raw material hBN body is required to be approximately 0.45 mol % or more.

From the sintered bodies of specimens 2 to 8, pieces of 2.5×2.5×1.5 mm were cut respectively and the heat conductivity of each piece was measured at room temperature by a direct measuring method using an InSb infrared radiation microscope. The results obtained are shown in Table 2 below.

TABLE 2

| Specimen No. | Added Amount | Appearance of Sintered Body | Heat conductivity |
|---|---|---|---|
| 1 | 0.439 mol % | gray and not transparent | not measured (partially white) |
| 2 | 0.498 mol % | gray and not transparent | 1.7 W/cm · °C. |
| 3 | 0.544 mol % | Gray and not transparent | 2.1 W/cm · °C. |
| 4 | 0.639 mol % | green and semi-transparent | 3.8 W/cm · °C. |
| 5 | 0.665 mol % | bluish green and semi-transparent | 4.8 W/cm · °C. |
| 6 | 0.909 mol % | bluish green and semi-transparent | 6.2 W/cm · °C. |
| 7 | 0.995 mol % | brown and semi-transparent | 5.1 W/cm · °C. |
| 8 | 1.291 mol % | brown and semi-transparent | 4.0 W/cm · °C. |

It is understood from Table 2 that a sintered body obtained with an amount of $Mg_3B_2N_4$ added to the material hBN body in a range from 0.6 mol % to 1.3 mol %, has a heat conductivity of approximately 4 W/cm.°C. or above, providing a maximum heat conductivity of 6.2 W/cm.°C. for 0.909 mol % of the additive.

EXAMPLE 2

For the purpose of examining the characteristics required for a sintered body for the desired heat conductivity, the particle diameter, the hardness and the impurity content of each of the specimens 2 to 8 obtained in example 1 were measured.

The particle diameter was measured by a scanning type electron microscope (SEM) after the surface of each specimen was etched with KOH to make clear the particle boundaries.

The hardness was examined by using a Vickers indentor under the load of 10 kg for 15 seconds.

The content of impurity, that is the content of Mg was measured by using an ion microanalyzer.

The results are shown in Table 3.

TABLE 3

| Specimen No. | Particle Diameter (μm) | Vickers Hardness | Mg Content (% by weight) |
|---|---|---|---|
| 2 | 2~10 | 2900~6300 | <0.1 |
| 3 | 2~12 | 4100~6100 | <0.1 |
| 4 | 5~12 | 5300~6100 | 0.1 |
| 5 | 7~15 | 6100~7100 | 0.1 |
| 6 | 10~17 | 5300~6100 | 0.3 |
| 7 | 12~20 | 5000~6100 | 0.5 |
| 8 | 12~27 | 6100~6900 | 0.7 |

Impurities other than Mg were analyzed by using an ion microanalyzer for each specimen and C, Al, Ca and Si were detected, the amount of each of them being less than 200 ppm.

From Example 1 and the results shown in Table 3, it is understood that a sintered body having a heat conductivity of 4W/cm.°C. or above, has a unit particle diameter of 5 μm or more, a Vickers hardness of 5000 Kg/mm² or more, and an Mg content of 0.7 % by weight or less.

EXAMPLE 3

Instead of the $Mg_3B_2N_4$ used in Example 1, $Li_3BN_2$, $Ca_3B_2N_4$ and $Sr_3B_2N_4$ were respectively diffused and contained in an amount of from 0.6 to 1.2 mol % in the hBN and sintered bodies were obtained in the same manner as in Example 1. In all of the sintered bodies thus obtained, the heat, conductivity was 4W/cm.°C. or above and the particle diameter, the hardness and the impurity content were almost the same as the results of Example 2.

EXAMPLE 4 hBN bodies containing 0.8~0.9 mol % of $Mg_3B_2N_4$ were obtained in the same manner as in Example 1. Thereafter, the body was put in a recipient and using a belt-type apparatus, six sintered bodies were formed under the conditions of 5.5 GPa and 1400° C., with the holding time being changed. The proportions of transformation to the cubic system boron nitride in the obtained sintered bodies were respectively 60%, 80%, 90%, 95%, 98% and 100%. The remaining portions were compounds of the not transformed hexagonal system boron nitride and the catalyst or additive.

The heat conductivity of each of the above stated sintered bodies was measured and the results are shown in Table 4 below.

From Table 4, it is understood that a sintered body having a volume ratio of cubic system boron nitride of 98% or more has a heat conductivity as high as 4.0 W/cm.°C. or above.

TABLE 4

| Items | No. | | | | | |
|---|---|---|---|---|---|---|
| | 1 | 2 | 3 | 4 | 5 | 6 |
| Sintering Pressure | 55 kb | → | → | → | → | → |
| Sintering Temperature | 1400° C. | → | → | → | → | → |
| Holding Time | 2 min. | 5 min. | 10 min. | 15 min. | 20 min. | 30 min. |
| Transformation Ratio | 60% | 80% | 90% | 95% | 98% | 100% |
| Heat Conductivity | 0.2 | 0.4 | 0.9 | 1.8 | 4.1 | 5.5 |

EXAMPLE 5

As a raw material, a hexagonal system boron nitride body containing uniformly dispersed 0.8 to 0.9 mol % of $Mg_3B_2N_4$ was prepared, and the material thus prepared was put in a recipient of Mo. Then, the material was subjected to a treatment under the conditions of 5.7 GPa and 1450° C. with the temperature being raised by two steps and sintered bodies were obtained. By changing the holding time in the first step, the lattice constants of the cubic system boron nitride of the sintered bodies were made different.

Table 5 shows the measured heat conductivity values of these sintered bodies.

From Table 5 it is understood that a high value of heat conductivity of 4.0 W/cm.°C. or above was obtained if the lattice constant of the cubic system boron nitride is in a range from 3.610 Å to 3.625 Å.

It is to be noted that the sintering time shown in Table 5 was 20 minutes in each case.

TABLE 5

| Items | Specimen No. | | | | |
|---|---|---|---|---|---|
| | 1 | 2 | 3 | 4 | 5 |
| Sintering Pressure | 57 kb | → | → | → | → |
| Sintering Temperature in the Second Step | 1450° C. | → | → | → | → |
| Raised Temperature in the First Step | 1250° C. | → | → | → | → |
| Holding Time in the First Step | 1 min. | 10 min. | 20 min. | 40 min. | 60 min. |
| Lattice Constant Å | 3.630 | 3.624 | 3.617 | 3.613 | 3.608 |
| Heat Conductivity W/cm · °C. | 2.0 | 4.3 | 5.9 | 6.0 | 3.4 |

EXAMPLE 6

As a starting material a hexagonal system boron nitride body containing uniformly dispersed 0.8 0.9 mol % of $Mg_3B_2N_4$ was prepared and this material was put in a recipient. Then, using a belt-type apparatus, the temperature was raised by two steps under the conditions of 5.5 GPa and 1450° C., whereby sintered bodies were formed with the holding time in the second step being changed in this example. The sintered bodies thus obtained were polished with fine diamond powder and then the particle boundary was checked by using a scanning type electron microscope. As a result it was found that the cubic system boron nitride particles were substantially continuous with the surrounding adjacent particles and no particle boundary was observed.

In addition, the relationship between an average value of the surface proportion of continuity and the heat conductivity was examined and the result is shown in Table 6 below.

TABLE 6

| Items | Specimen No. | | | | |
|---|---|---|---|---|---|
| | 1 | 2 | 3 | 4 | 5 |
| Proportion of Continuity | 40% | 50% | 60% | 80% | 85% |
| Heat Conductivity W/cm · °C. | 2.3 | 2.9 | 4.0 | 4.5 | 6.1 |

As described above, U.S. Pat. No. 4,188,194 discloses a metallization technique in which the surface of cubic boron nitride is coated with Ni by sputtering and further coated with silver. However, such coating films have the disadvantage that the adhesion to the cubic system boron nitride sintered body is insufficient and accordingly, they are liable to be detached at the time of inserting the heat sink in a substrate. By contrast, in a heat sink using a cBN sintered body of the present invention, the above stated disadvantages have been avoided and coating films having an excellent adhesion property can be provided. More specifically, a sintered body of the present invention may be provided on its surface with coating layers of one or more transition metals of the groups IVa, Va and VIa of the periodic table or the alloys thereof. In this case, boride, nitride or boron nitride of such metals is formed by a reaction of the metal with the cBN in the interface, said reaction resulting in a chemical reaction bond providing a strong adherence of the coating films to the cBN body. Copper or a copper alloy is useful for forming such a coating film, especially in a heat sink.

In addition, in the present invention, one or more coating layers of metals not oxidized at a temperature of 300° C. or alloys thereof may be provided for preventing oxidation of the metal of the coating films. As the metals which are not oxidized at a temperature of 300° C., Au, Ag, Cu, Pt, Al, Ni, Co and the like are preferred. The temperature of 300° C. is based on the fact that the maximum temperature necessary for adhesion between a semiconductor device and lead wires, between the semiconductor device and the sink, and between the heat sink and the substrate is approximately 300° C.

EXAMPLE 7

The sintered body of specimen 4 in Example 5 was cut into 20 pieces each having a size of 1 mm² and 0.4 mm thickness. After that, the pieces were heated to a high temperature and Ti was coated to a thickness of 500 Å on the surface of each piece. Then, each piece was further coated to a thickness of 1 μm of the Ti coating layer. Then, a semiconductor laser device was soldered on each sintered body thus formed and leads were connected.

For comparison, a BeO body was cut into 20 pieces each having the same size as described above and in the same manner a coating was applied and semiconductor laser devices of the same kind were placed on the specimens.

When an electric current of 150 mA was caused to flow through the device, the surface temperature of each device was measured. As a result, it was observed that the temperature of the devices each provided with a heat sink comprising a cubic system boron nitride sintered body in accordance with the present invention was lowered by approximately 15° C.

In addition, in a scratching test using a sapphire needle, some of the coating films of the heat sinks of BeO were detached, while the coating films on the sintered bodies in accordance with the present invention were not detached.

Furthermore, the interface between the cBN sintered body and a coating film was examined by a TEM and there was found titanium boride.

EXAMPLE 8

The sintered body of specimen 5 in Example 5 was cut into four pieces each having a size of 100 mm$^2$ and 0.5 mm in thickness.

Then, the pieces were heated and Cr was coated on the surface of each piece and Ni and Ag were further coated thereon. Each of the sintered bodies containing the coating films thus formed was attached to an IC substrate. As a result, it was observed that the IC operated more stably and the lifetime of the IC became remarkably long.

Now, in the following, a concrete structure of a heat sink for an IC using a sintered body in accordance with the present invention will be described.

A sintered body of the invention is shaped such that the area of the outer surface of the sintered body may be relatively larger than the surface thereof facing the semiconductor device for improving the heat radiation property. For the shaping there are the following three possibilities:

(a) The surface area of the heat sink on the side of an envelope is made larger than the area of the portion of the heat sink contacting the IC device so that the heat content per unit area is lowered on the side of the envelope. Thus, the temperature of the heat sink material can be made close to the temperature of the external atmosphere and accordingly, the temperature of the IC device can be lowered effectively.

(b) The surface area of the heat sink in the portion contacting the external gas or liquid is made large so that the heat conduction to the exterior is improved.

(c) Radiation fins are provided in the portion of the heat sink contacting the external gas or liquid so that the heat radiation property is further improved.

The above described heat sink uses a cBN sintered body having an excellent heat conductivity and being shaped such that the area of the outer surface thereof is relatively large compared with the surface thereof on the side facing the semiconductor device, whereby heat can be emitted efficiently from the inside of the device to the exterior not only because of the good heat conductivity of the material itself but also because of its structure.

Figure 5A:
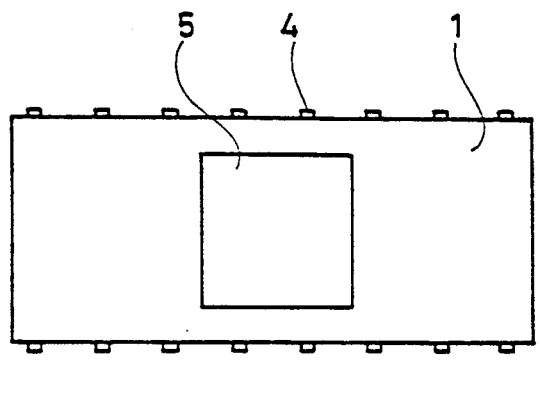
FIGS. 5A and 5B are respectively plane and side sectional views showing an IC device wherein a heat sink in accordance with the present invention is applied as a first example.
Figure 5B:
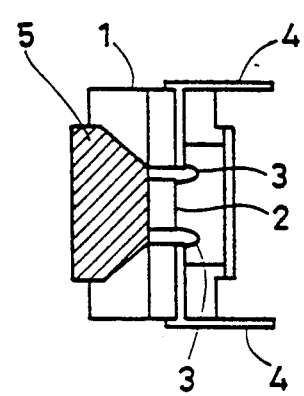

FIGS. 5A and 5B are respectively plane and side sectional views of the first example of a heat sink in accordance with the present invention. Referring to FIGS. 5A and 5B, a Si device or a compound semiconductor 2 as an IC device is disposed in an envelope 1 and input and output pins 4 are provided through leads 3 connected to the Si device 2.

On the other hand, in the envelope 1 on the side of the Si device 2, a tapered opening is formed, the diameter thereof being small on the inner side and increasing toward the outer surface of the envelope 1. In accordance with an embodiment of the present invention, a heat sink 5 for an IC device is placed in the opening. As is shown in FIG. 5B, the heat sink 5 has a form corresponding to the tapered opening and accordingly the surface area thereof on the side of the Si device 2 as the semiconductor device is small and the surface area thereof on the outer side of the envelope 1, that is on the side contacting the external atmosphere, is increased. Thus, as described above, the heat content per unit area of the heat sink is smaller on the outer side than on the side of the Si device 2 and radiation of heat becomes more efficient.

Figure 6A:
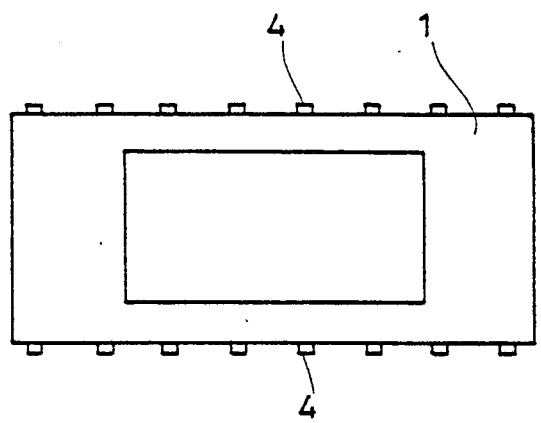
FIGS. 6A and 6B are respectively plane and side sectional views of an IC device wherein a heat sink in accordance with the present invention is applied as a second example.
Figure 6B:
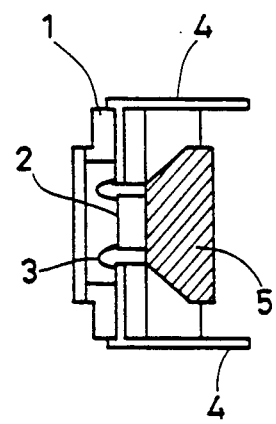

FIGS. 6A and 6B are respectively plane and side sectional views of an IC device where the second example of a heat sink in accordance with the present invention is applied. In this example, the envelope 1 and the heat sink 5 are formed in the direction in which the input and output pins 4 extend. The other portions are the same as in the example shown in FIGS. 5A and 5B. Accordingly, it is understood that heat is radiated efficiently also in the heat sink 5 of this example.

Figure 7A:
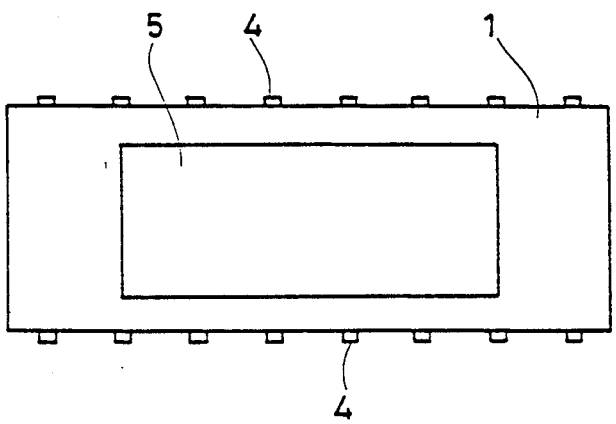
FIGS. 7A and 7B are respectively plane and side sectional views of an IC device wherein a heat sink in accordance with the present invention is applied as a third example.
Figure 7B:
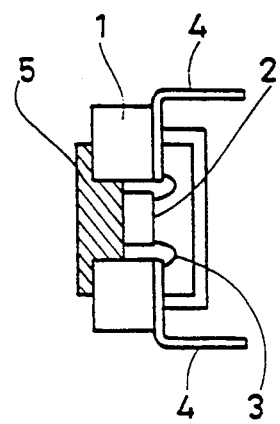

FIGS. 7A and 7B are respectively plane and side sectional views of an IC device where the third example of a heat sink in accordance with the present invention is applied. In this third example, a through hole not tapered is formed in the envelope and the heat sink 5 for the IC is placed in the through hole. However, the heat sink 5 in this example extends on the outer side of the envelope 1 over a range wider than the diameter of the through hole. More specifically, the heat sink 5 is provided over an area larger than the opening area so as to be in contact with the outer surface of the envelope 1. Accordingly, also in this example, in the same manner as in the example shown in FIGS. 5A and 5B, the surface area of the heat sink 5 on the external side is made larger than that on the side of the Si device 2 and the same improved heat radiation effect can be obtained.

Figure 8A:
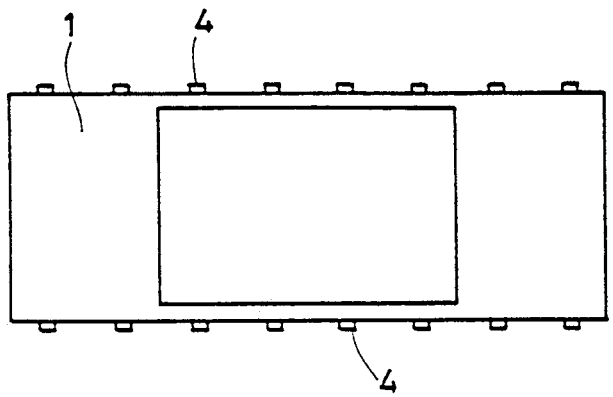
FIGS. 8A and 8B are respectively plane and side sectional views of an IC device wherein a heat sink in accordance with the present invention is applied as a fourth example.
Figure 8B:
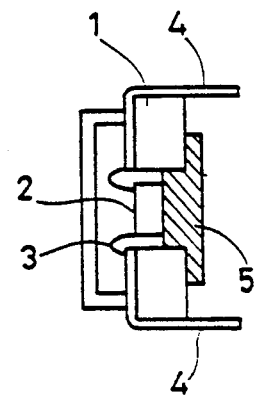

FIGS. 8A and 8B are respectively plane and side sectional views of a device where the fourth example of a heat sink in accordance with the present invention is applied. In this fourth example, in the same manner as in the heat sink 5 of the example shown in FIGS. 6A and 6B, the envelope 1 and the heat sink 5 for the IC are provided in the direction in which the input and output pins 4 extend. The structure of the envelope 1 and heat sink 5 are the same as those in the third example shown in FIGS. 7A and 7B and therefore, the same effect can be obtained.

Figure 9A:
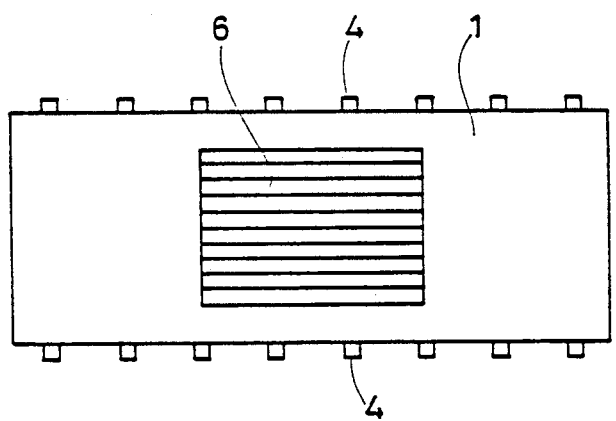
FIGS. 9A and 9B are respectively plane and side sectional views of an IC device wherein a heat sink in accordance with the present invention is applied as a fifth example.
Figure 9B:
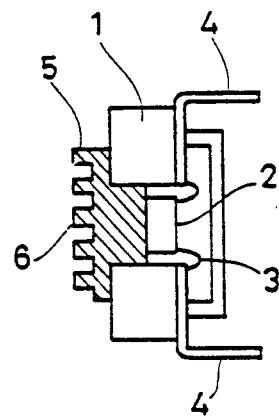
Figure 10A:
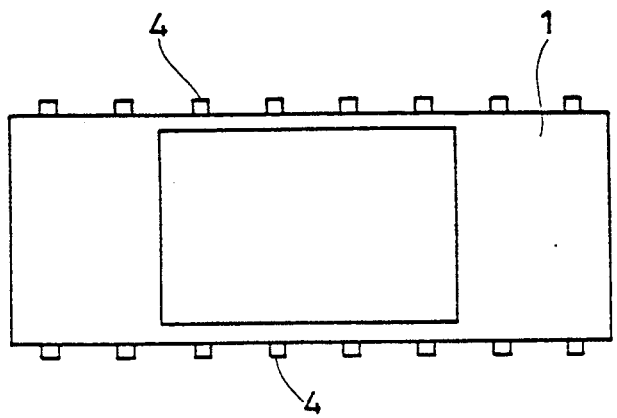
FIGS. 10A and 10B are respectively plane and side sectional views of an IC device wherein a heat sink in accordance with the present invention is applied as a sixth example.
Figure 10B:
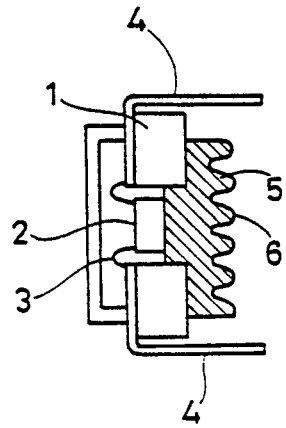
Figure 11A:
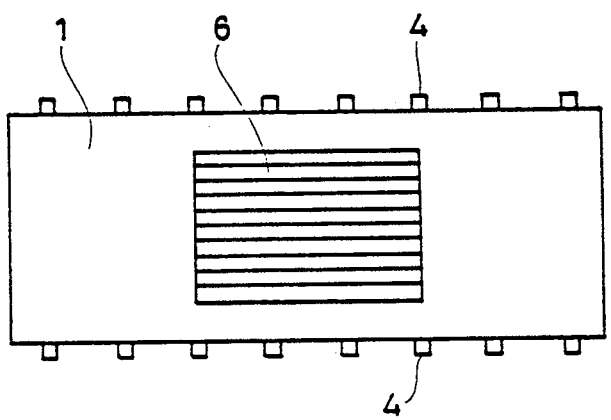
FIGS. 11A and 11B are respectively plane and side sectional views of an IC device wherein a heat sink in accordance with the present invention is applied as a seventh example.
Figure 11B:
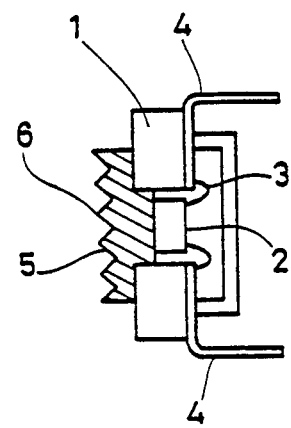

FIGS. 9A and 9B are plane and side sectional views of a device where the fifth example of a heat sink in accordance with the present invention is applied. In this fifth example, radiation fins 6 are formed on the external side of the heat sink 5. The other portions are the same as in the example shown in FIGS. 7A and 7B. It is understood that the example shown in FIGS. 9A and 9B has a further improved radiation characteristic compared with the third example since the radiation fins 6 are provided in this fifth example.

The form of the radiation fins 6 is not limited to that shown in FIGS. 9A and 9B. They may have any suitable form as shown in the sixth to eighth examples in FIGS. 10A–10B, 11A–11B and 12A–12B. In any of these forms, the area of the fins 6 can be made larger than the outer surface area of the heat sink 5 and accordingly, the heat radiation characteristic can be further improved.

Figure 12A:
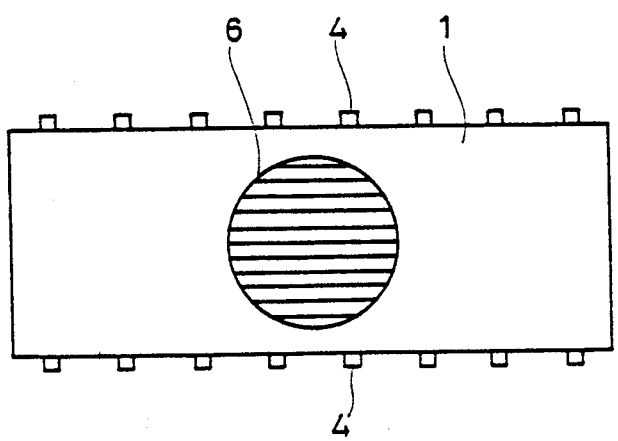
FIGS. 12A and 12B are respectively plane and side sectional views of an IC device wherein a heat sink in accordance with the present invention is applied as an eighth example.
Figure 12B:
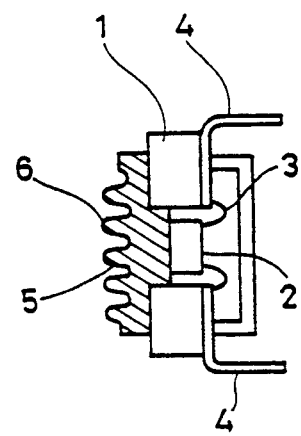
Figure 13:
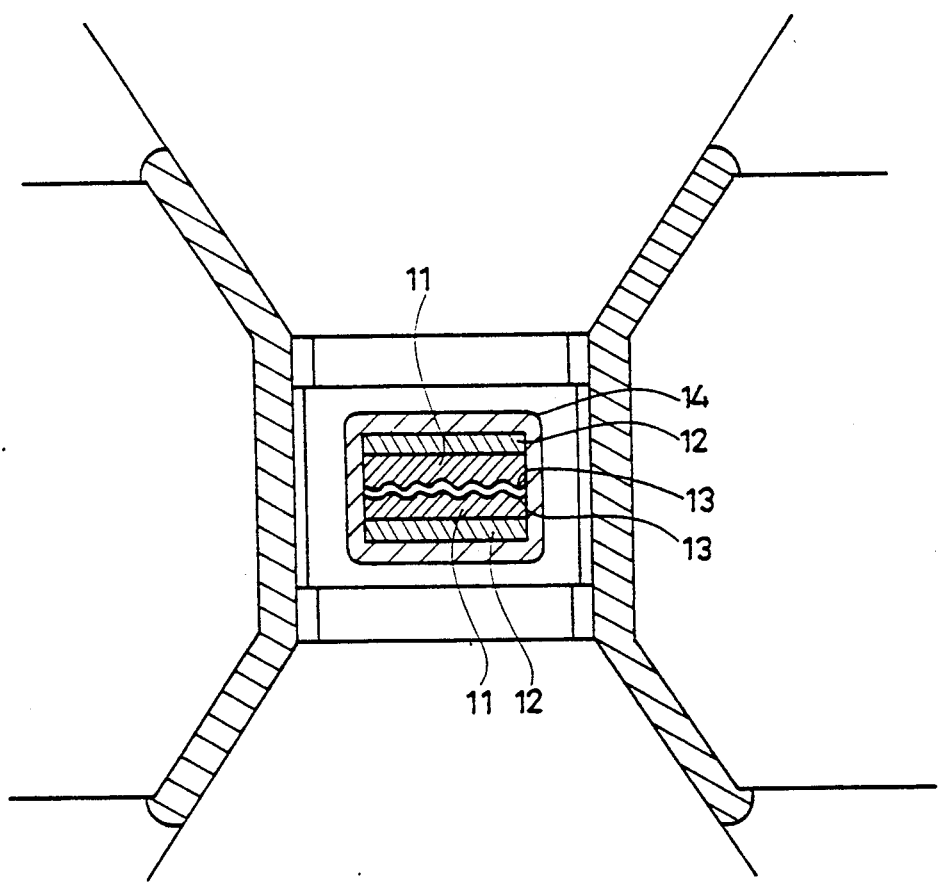
FIG. 13 is a partial front section for explaining the process for manufacturing the heat sink of the eighth example.

Now, an example of a method of manufacturing a heat sink for an IC in accordance with the present invention will be described with reference to FIG. 13 shown partially in section. As shown in FIG. 13, in a girdle-type extra-high pressure generating apparatus, cBN bodies 11 containing diffused magnesium boron nitride are disposed respectively between the ultra-hard alloy plates 12 and the Mo plates 13 of 0.1 mm in thickness shaped according to the form of the radiation fins so that a multilayer structure is formed. The thus formed multilayer structure is placed in a recipient 14 of Mo. Then, under a pressure of 5.5 GPa, the Mo recipient 14 is heated at a temperature of 1450° C. for 30 minutes. After that, the sintered bodies 11 are taken out from the Mo recipient 14. In advance, the respective surfaces of the Mo plates 13 disposed between the respective sintered bodies 11 have been coated with a peeling agent so that the multilayer sintered bodies 11 may be easily separated from one another. The sintered bodies 11 taken out of the recipient are separated with the Mo plates 13 being attached thereto. The Mo plate 13 attached to the surface of each sintered body 11 is removed for example by a treatment using an acid such as nitric acid, whereby the same form as that of the radiation fins 6 of the heat sink 5 in the example shown in FIGS. 12A and 12B can be obtained.

On the face portion of contact between the thus obtained sintered body 11 and the IC device, a multilayer coating film of Ti and Ni and Au is formed and this coating film is soldered by Au-Sn to the IC logic device, so that the structure thus formed is fixed to the envelope whereby the IC device shown in FIGS. 12A and 12B can be obtained. For comparison, an IC device as shown in FIGS. 12A and 12B was manufactured using a heat sink of BeO and the performances of the heat sinks of both IC devices were tested. In this test, the same electric power and the same electric current were applied and the temperatures on the surface of the envelopes of both IC devices were measured. As a result, it was ascertained that the device using the heat sink of the present invention had a lower temperature and exhibited improved characteristics when it was operated.

Although the present invention has been described and illustrated in detail, it is clearly understood that the same is by way of illustration and example only and is not to be taken by way of limitation, the spirit and scope of the present invention being limited only by the terms of the appended claims.

What we claim is:

1. A boron nitride system produced from a starting material including a hexagonal, non-pyrolytic boron nitride having diffused therein, as an additive, a member selected from the group consisting of an alkaline earth metal boron nitride ($Me'_3B_2N_4$) and an alkali boron nitride ($Me_3BN_2$) in an amount within the range of 0.6 mol % to 1.3 mol % of said hexagonal, nonpyrolytic boron nitride, and wherein after conversion of said hexagonal, non-pyrolytic boron nitride by sintering, said system comprises a sintered body comprising cubic boron nitride within the range of 99.9% by weight up to 99.3% by weight of said sintered body and a metal remainder in the form of said metal of said additive, said metal remainder being present in said sintered cubic boron nitride body within the range of 0.1% by weight when said additive is 0.6 mol %, and 0.7% by weight when said additive is 1.3 mol %, except for minute quantities of naturally occurring impurities, said cubic boron nitride sintered body having a thermal conductivity of at least 4 W/cm.°C. due to the presence of said metal remainder, said system further comprising on a surface of said cubic boron nitride sintered body, a coating having a thickness of 1 μm or less made of at least one transition metal selected from the group consisting of groups IVa, Va, and VIa of the periodic table and alloys thereof, and an interface between said sintered body of cubic boron nitride and said coating, said interface including a member selected from the group consisting of boride, nitride and boron nitride formed by a reaction between said transition metal of said coating with said cubic boron nitride, said reaction forming a reaction bond between said sintered body of cubic boron nitride and said coating for an improved adherence between the cubic boron nitride body and said coating.

2. The boron nitride system of claim 1, wherein said cubic boron nitride sintered body has a lattice constant within the range of 3.610 Å to 3.625 Å.

3. The boron nitride system of claim 1, wherein said cubic boron nitride sintered body has a Vickers hardness within the range of 5000 kg/mm² to 7100 kg/mm².

4. The boron nitride system of claim 1, wherein said cubic boron nitride sintered body has particles with a particle diameter within the range of 5 μm to 20 μm.

5. The boron nitride system of claim 1, further comprising at least one second coating on said first mentioned coating, said second coating comprising a material selected from the group consisting of Au, Ag, Cu, Pt, Al, Ni, and Co and alloys of members of said group.

6. The boron nitride system of claim 1, wherein said cubic boron nitride sintered body is a heat sink.

7. The system of claim 1, wherein said conversion of said hexagonal, non-pyrolytic boron nitride has been performed at a temperature of at least 1350° C. and a pressure sufficient to establish a thermodynamically stable condition for said cubic boron nitride.

8. The system of claim 1, wherein said thermal conductivity is within the range of 4 W/cm.°C. to 6.2 W/cm.°C., and wherein said metal remainder is one of about 0.1% wt. and 0.7% wt. of the cubic boron nitride sintered body when the thermal conductivity is 4 W/cm.°C., said metal remainder being 0.3% wt. of the cubic boron nitride sintered body when the thermal conductivity is 6.2 W/cm.°C.

* * * * *

UNITED STATES PATENT AND TRADEMARK OFFICE
CERTIFICATE OF CORRECTION

PATENT NO. : 5,332,629
DATED : July 26, 1994
INVENTOR(S) : Hitoshi Sumiya; Shuichi Sato; Shuji Yazu It is certified that error appears in the above-indentified patent and that said Letters Patent is hereby corrected as shown below:

On the title page, item [54] and column 1, line 4, "CNB" should read --cBN--.

In col. 1, line 3 of the title, "CNB" should read --CBN--.
In col. 5, line 59 "$Mg_3B_2N_4$being" should read: --$Mg_3B_2N_4$ being--.
In col. 6, line 11, "1.3mol %." should read: --1.3 mol %.--.
In col. 7, line 29, "nun" (both instances) should be --mm--.
In claim 1, col. 14, line 28, replace "with" by --and--.

Signed and Sealed this

Twenty-fifth Day of October, 1994

Attest:

BRUCE LEHMAN

*Attesting Officer*     *Commissioner of Patents and Trademarks*